United States Patent
Kawahara et al.

(10) Patent No.: US 9,528,668 B2
(45) Date of Patent: Dec. 27, 2016

(54) ORGANIC ELECTROLUMINESCENT ILLUMINATING DEVICE

(71) Applicant: Konica Minolta, Inc., Tokyo (JP)

(72) Inventors: Yusuke Kawahara, Tokyo (JP); Agato Nagata, Tokyo (JP); Hisato Ogata, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/179,703

(22) Filed: Feb. 13, 2014

(65) Prior Publication Data

US 2015/0060779 A1 Mar. 5, 2015

(30) Foreign Application Priority Data

Sep. 4, 2013 (JP) ................. 2013-183150

(51) Int. Cl.

| | | |
|---|---|---|
| *F21S 6/00* | (2006.01) | |
| *F21S 8/00* | (2006.01) | |
| *F21S 8/06* | (2006.01) | |
| *F21S 10/02* | (2006.01) | |
| *H01L 27/32* | (2006.01) | |
| *F21W 121/00* | (2006.01) | |
| *F21Y 105/00* | (2016.01) | |

(52) U.S. Cl.
CPC ............... *F21S 6/005* (2013.01); *F21S 8/033* (2013.01); *F21S 8/06* (2013.01); *F21S 10/02* (2013.01); *F21W 2121/00* (2013.01); *F21Y 2105/00* (2013.01); *F21Y 2113/10* (2016.08); *F21Y 2115/20* (2016.08); *H01L 27/3209* (2013.01); *H01L 2251/5361* (2013.01)

(58) Field of Classification Search
CPC ....................................................... H01L 27/32
USPC ...... 257/40; 362/285, 184, 199, 249.08, 418, 362/31, 27
See application file for complete search history.

(56) References Cited

U.S. PATENT DOCUMENTS

| | | | | |
|---|---|---|---|---|
| 5,263,569 | A * | 11/1993 | Hiramoto et al. | 198/468.4 |
| 5,664,747 | A * | 9/1997 | Eilering | 248/123.11 |
| 6,357,893 | B1 * | 3/2002 | Belliveau | 362/285 |
| 6,629,765 | B2 * | 10/2003 | Toyoda et al. | 362/612 |
| D732,227 | S * | 6/2015 | Blum et al. | D26/88 |
| 2010/0110687 | A1 * | 5/2010 | Zheng | 362/249.06 |

(Continued)

FOREIGN PATENT DOCUMENTS

| | | |
|---|---|---|
| JP | 2005332773 A | 12/2005 |
| JP | 2008243772 A | 10/2008 |

(Continued)

OTHER PUBLICATIONS

Notification of Refusal dated Jun. 28, 2016 from the corresponding Japanese Application; Application No. 2013-183150; English translation of Notification of Refusal; Total of 10 pages.

*Primary Examiner* — Sheng Zhu

(74) *Attorney, Agent, or Firm* — Lucas & Mercanti, LLP

(57) ABSTRACT

An organic electroluminescent illuminating device is shown. The device includes, at least on flexible surface light-emitting unit and a single driving unit. The flexible surface light-emitting unit has a flexible substrate and at least one organic electroluminescent element on the flexible substrate. The single driving unit drives the flexible surface light-emitting unit. At least a portion of the flexible surface light-emitting unit is connected to the driving unit.

17 Claims, 14 Drawing Sheets

(56) References Cited

U.S. PATENT DOCUMENTS

| | | | |
|---|---|---|---|
| 2011/0249425 A1* | 10/2011 | Aurongzeb et al. | 362/102 |
| 2012/0307423 A1* | 12/2012 | Bohn et al. | 361/679.01 |
| 2013/0044487 A1* | 2/2013 | Burrows et al. | 362/249.08 |
| 2015/0062901 A1* | 3/2015 | Chen | 362/249.04 |

FOREIGN PATENT DOCUMENTS

| | | |
|---|---|---|
| JP | 2010-003547 A | 1/2010 |
| JP | 2012-256525 A | 12/2012 |
| JP | 2012256525 A | 12/2012 |
| JP | 2013528897 A | 7/2013 |

\* cited by examiner

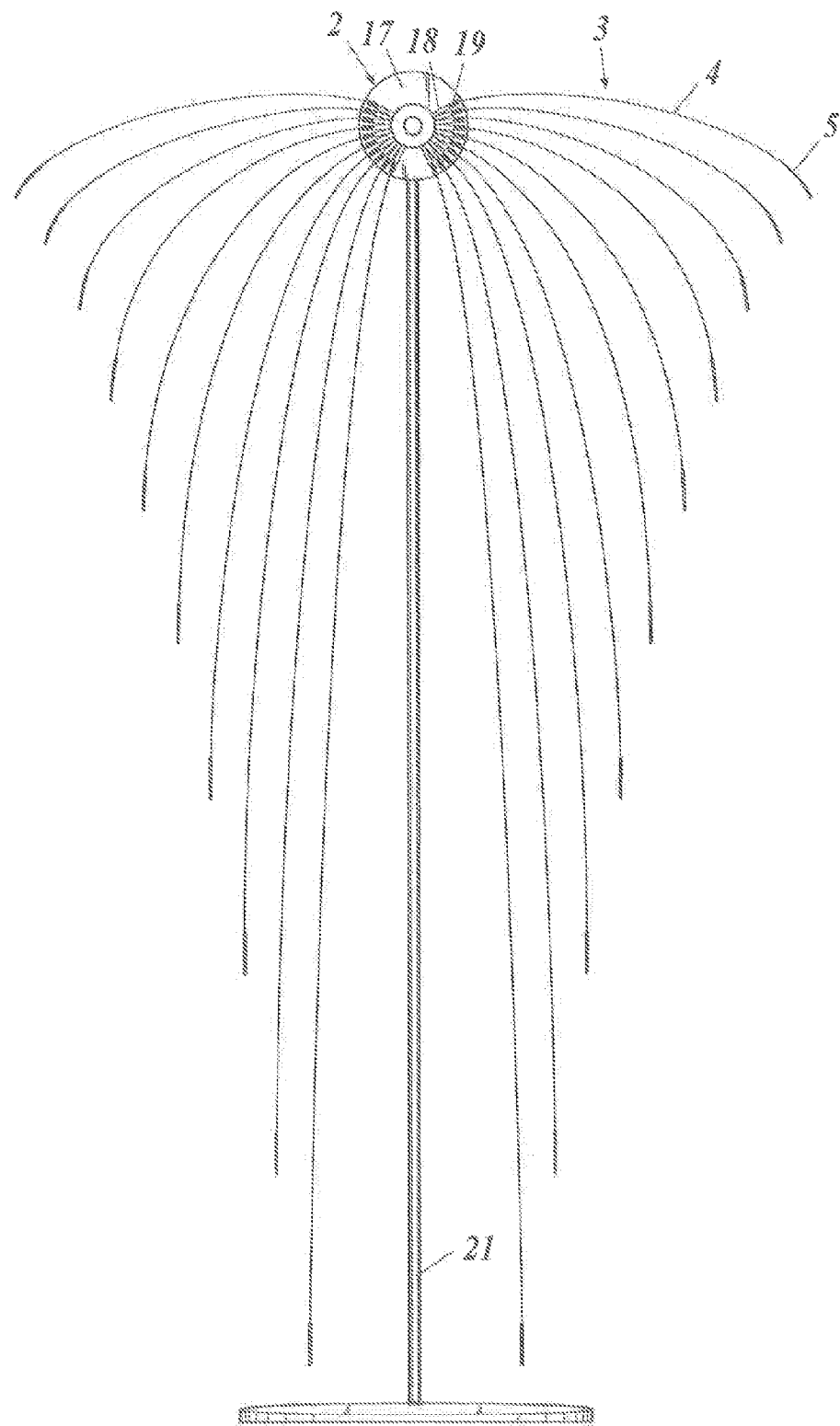

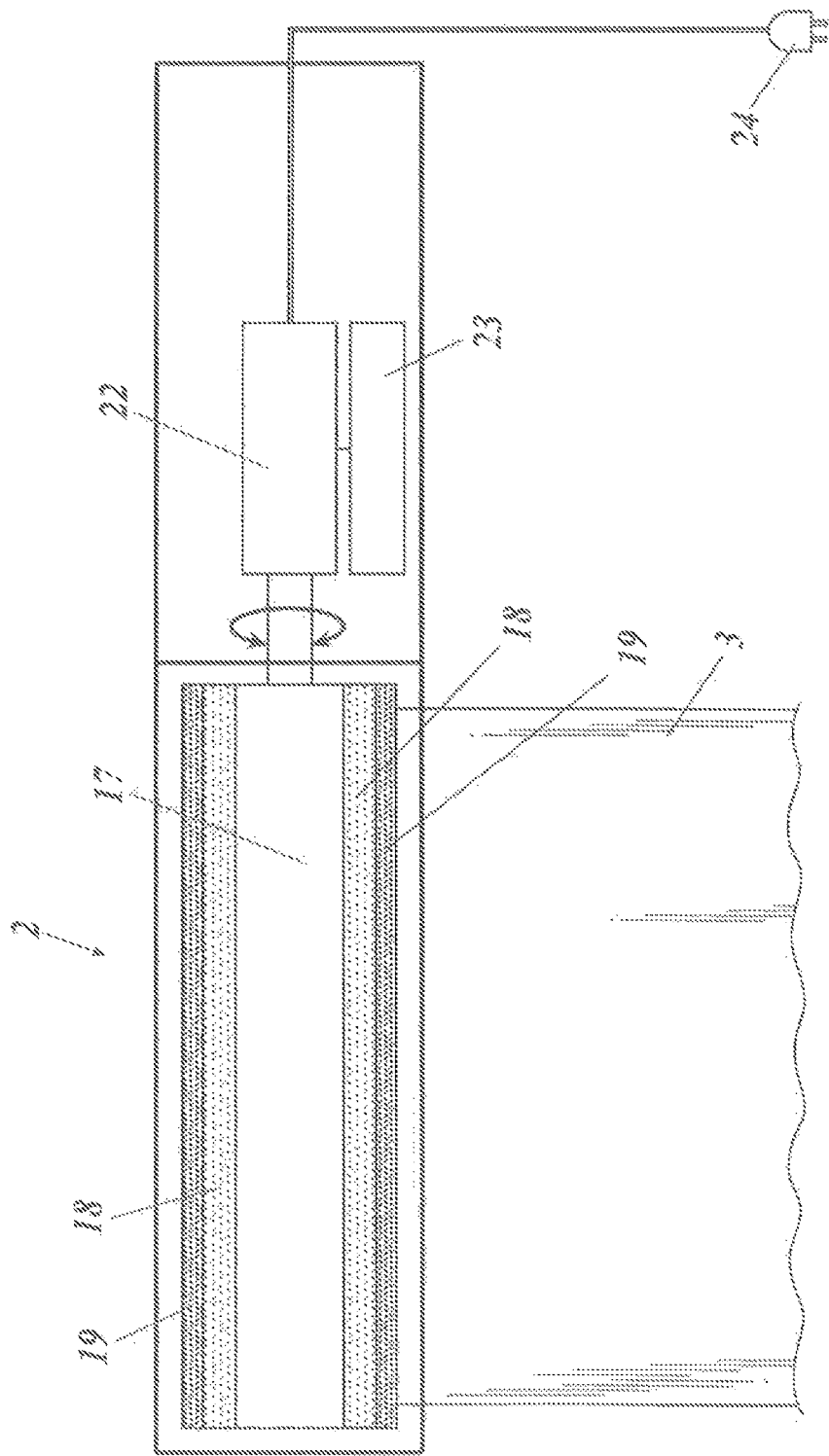

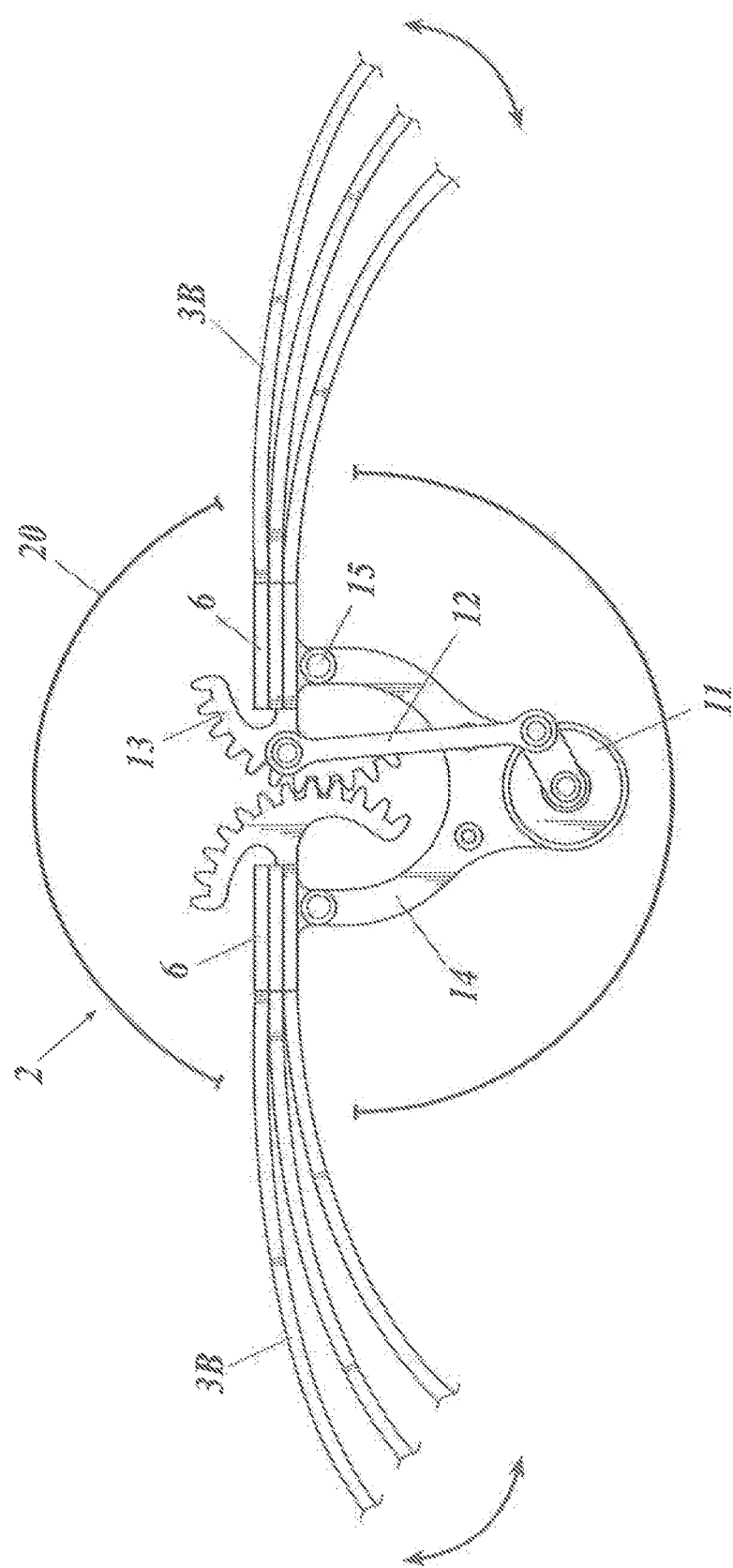

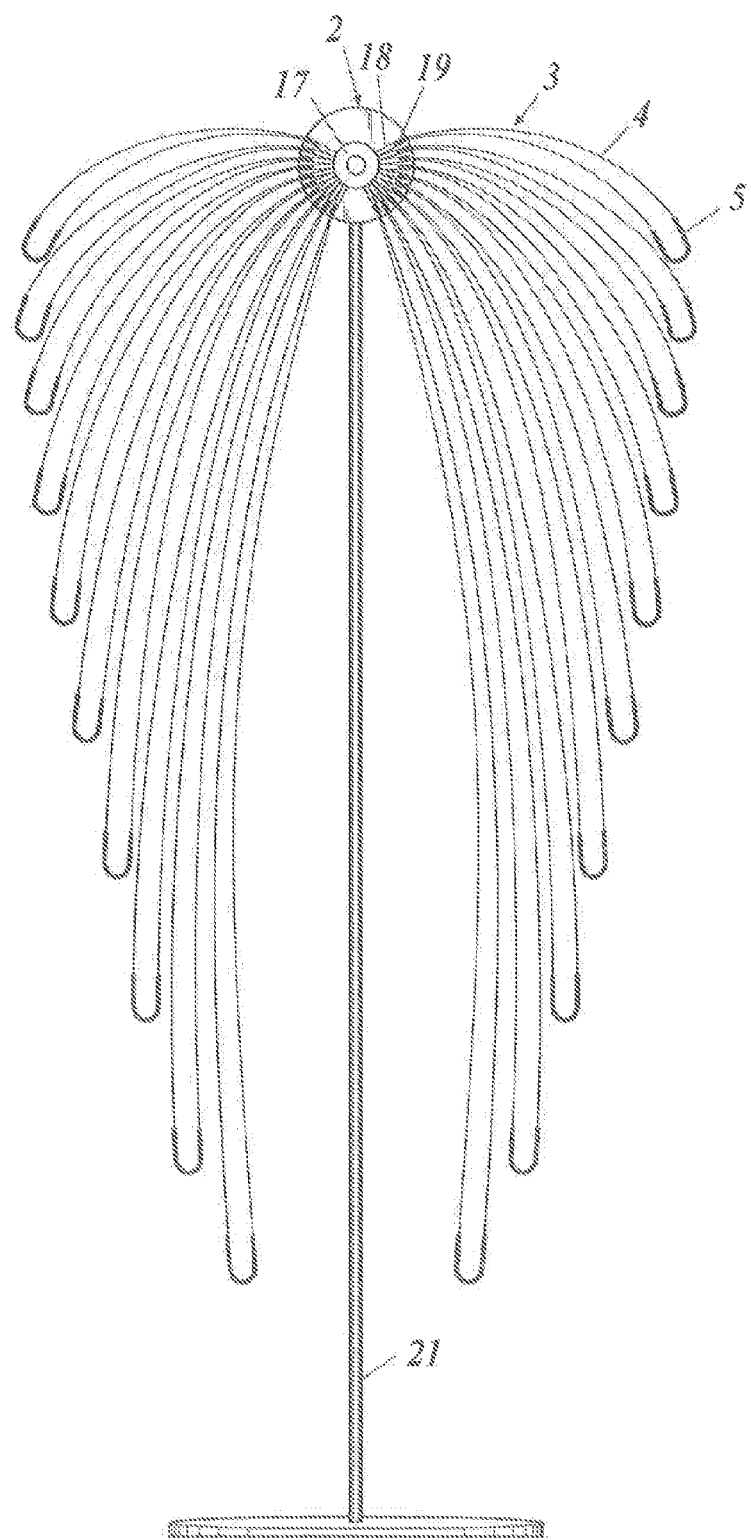

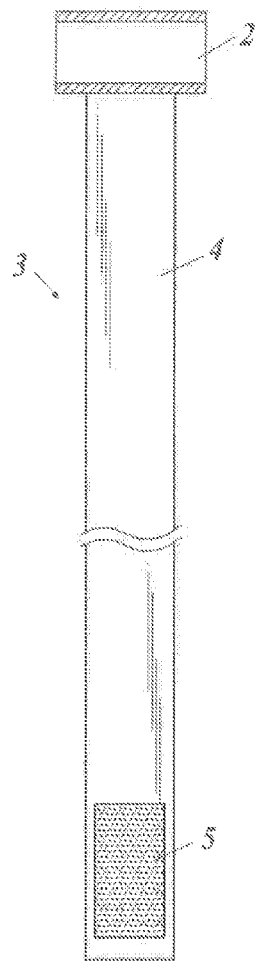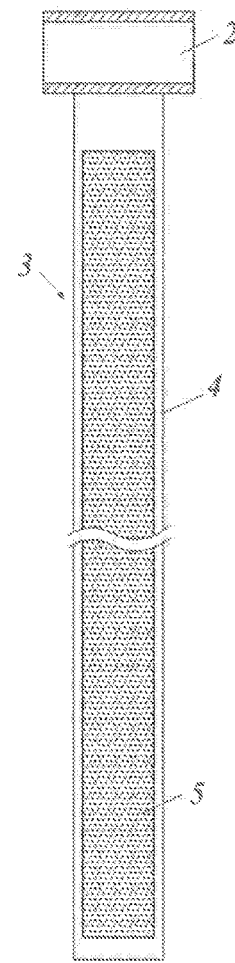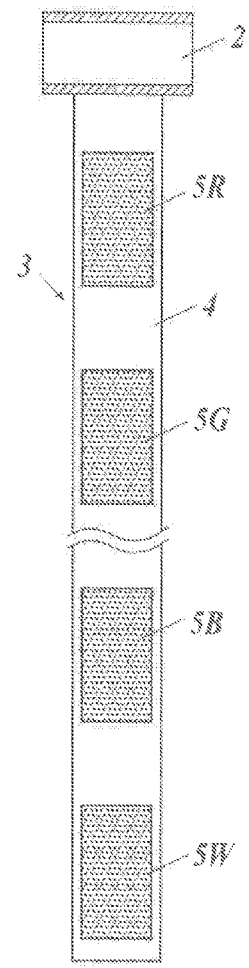

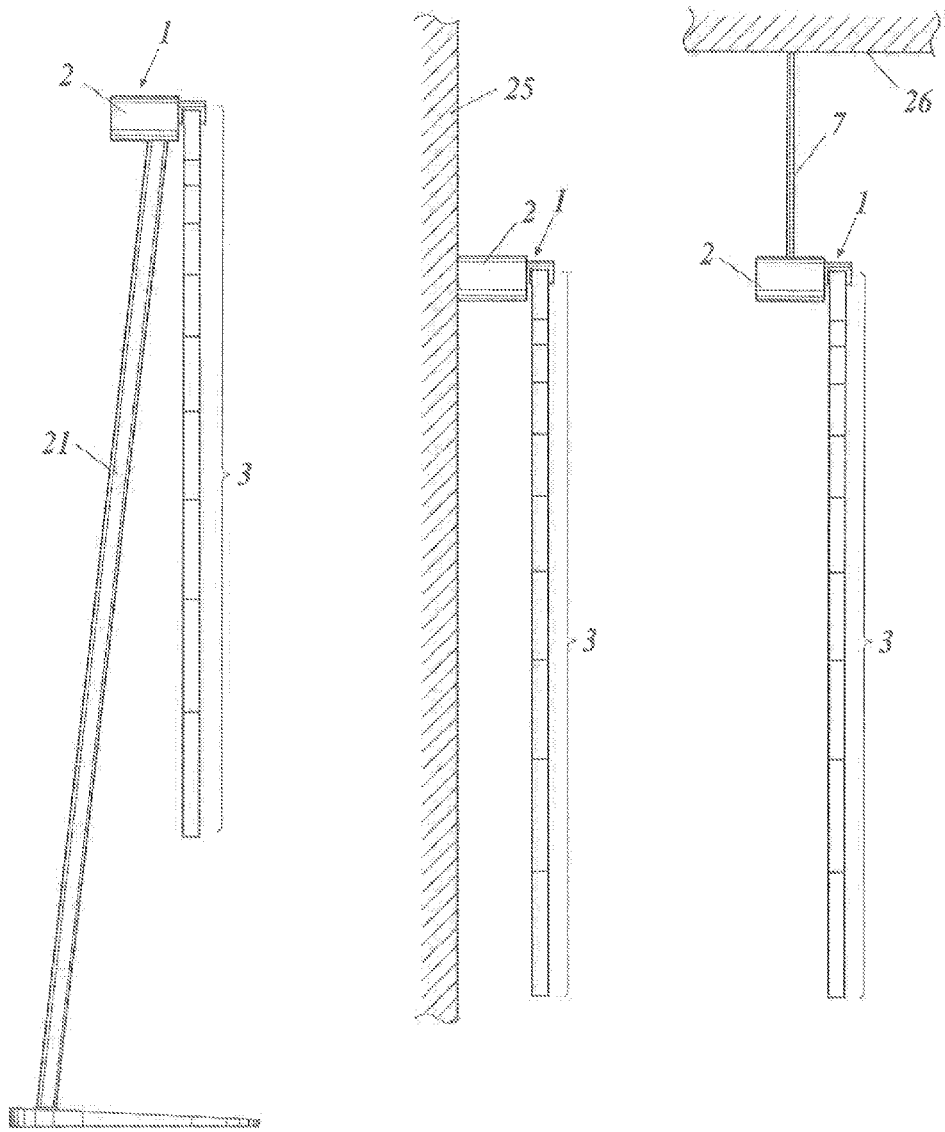

ORGANIC ELECTROLUMINESCENT ILLUMINATING DEVICE

CROSS REFERENCE TO RELATED APPLICATION

This Application claims the priority of Japanese Patent Application No. 2013-183150 filed on Sep. 4, 2013, which is incorporated by reference herein.

BACKGROUND

Field of the Invention

The present invention relates to an organic electroluminescent illuminating device including a driving unit and a flexible surface light-emitting unit provided with an organic electroluminescent element.

Description of Related Art

In recent years, illuminating devices provided with light sources composed of a surface light-emitting unit including an organic electroluminescent element (hereinafter referred to as "organic EL element") have attracted attention. A common organic EL element is composed of an anode, a cathode, and an organic functioning layer including a light-emitting sublayer (a thin film of an organic compound including a light-emitting organic compound), the organic layer being disposed between the anode and the cathode. The organic EL element is driven by current flowing therethrough via the anode and the cathode to emit light and is used in decorative lights, signal light sources, light-emitting posters, illuminating devices, and other devices.

New applications of illuminating devices including organic electroluminescent elements have recently been required to provide a room light exhibiting sufficient flexibility, three-dimensional appearance, and a sense of depth, which are advantageous for dramatic and decorative impact, and demonstrating the dramatic and decorative impact inherent in the properties of the organic electroluminescent elements.

To meet such a requirement, U.S. Patent application publication. No. 2013/0044487 discloses an illuminating device including a flexible organic electroluminescent element with two ends connected to rotatable supports to dynamically change the state of the bend, although it does not disclose a specific method of driving an illuminating device including a flexible organic electroluminescent element. Unfortunately, in this structure, the two ends of the flexible rectangle organic electroluminescent element are each fixed to two supports, so that the organic electroluminescent element cannot be smoothly moved, resulting in insufficient dramatic or decorative impact.

Japanese Unexamined Patent Application Publication Nos. 2010-003547 and 2012-256525 each disclose an illuminating device which is openable like petals, includes a plurality of circularly-disposed surface light-emitting units, parts of which are connected to a driving device. An accompanying photosensor detects the intensity of external light such that the petal-like surface light-emitting units open in the dark. Unfortunately, in this structure, the surface light-emitting units are composed of an inflexible or rigid material to form a petal-like shape; hence, the organic electroluminescent element cannot be smoothly moved, resulting in insufficient dramatic or decorative impact.

No illuminating devices have yet appeared which include surface light-emitting units provided with flexible organic electroluminescent units having various shapes and movable naturally and smoothly, resulting in insufficient dramatic or decorative impact. An attractive illuminating device free from such problems is therefore required.

SUMMARY

An object of the present invention, which has been, made to solve such problems, is to provide an organic electroluminescent illuminating device serving as an artistic and decorative gorgeous ornament provided with a flexible surface light-emitting unit that can move naturally and smoothly.

The inventors have studied to solve the problems and found that an organic electroluminescent illuminating device including a flexible surface light-emitting unit provided with an organic electroluminescent element, and a single driving unit for driving the flexible surface light-emitting units, at least one flexible surface light-emitting unit being connected to the driving unit, can move naturally and smoothly and serve as an artistic and decorative gorgeous ornament, and thus have completed the present invention.

In order to achieve at least one of the above-described objects, according to an aspect of the present invention, there is provided an organic electroluminescent illuminating device including:
  at least one flexible surface light-emitting unit which has a flexible substrate and at least one organic electroluminescent element on the flexible substrate; and
  a single driving unit which drives the flexible surface light-emitting unit,
  wherein at least a portion of the flexible surface light-emitting unit is connected, to the driving unit.

Preferably, in the organic electroluminescent illuminating device, at least two flexible surface light-emitting units are connected to the driving unit, the flexible surface light-emitting units being paired.

Preferably, in the organic electroluminescent illuminating device, the flexible surface light-emitting unit is in the form of a strip.

Preferably, in the organic electroluminescent illuminating device, both ends of the flexible surface light-emitting unit are connected to the driving unit to form a loop.

Preferably, in the organic electroluminescent illuminating device, at least three flexible surface light-emitting units are connected to the driving unit.

Preferably, in the organic electroluminescent illuminating device, the flexible substrate includes a flexible resin film, a flexible metal plate, or a flexible glass plate.

Preferably, in the organic electroluminescent illuminating device, the organic electroluminescent element is disposed only at an end of the flexible surface light-emitting unit.

Preferably, in the organic electroluminescent illuminating device, the organic electroluminescent element is disposed continuously or discretely over an entire surface of the flexible surface light-emitting unit.

Preferably, in the organic electroluminescent illuminating device, at least one organic electroluminescent element emits white light.

Preferably, in the organic electroluminescent illuminating device, at least one organic electroluminescent element emits blue light, green light, or red light.

Preferably, in the organic electroluminescent illuminating device, the illuminating device is fixed to a stand or on a wall.

Preferably, in the organic electroluminescent illuminating device, wherein the illuminating device is hung from a ceiling.

BRIEF DESCRIPTION OF THE DRAWINGS

The present invention, and the above-described objects, features and advantages thereof will become more fully understood from the following detailed description with the accompanying drawings and wherein;

FIG. 6 is a schematic view illustrating an example state of the driving unit holding the flexible surface light-emitting units;

FIG. 7 is a schematic view illustrating an example internal configuration of the driving unit;

FIG. 8 is a schematic cross-sectional view of an example organic EL illuminating device having a driving plate with a plurality of flexible surface light-emitting units disposed thereon;

FIG. 10 is a schematic view of an example organic EL illuminating device with a driving unit connected to loop flexible surface light-emitting units;

FIG. 11A is a schematic view illustrating an example arrangement of an organic EL element in a flexible surface light-emitting unit;

FIG. 11B is a schematic view illustrating another example arrangement of an organic EL element in a flexible surface light-emitting unit;

FIG. 11C is a schematic view illustrating another example arrangement of organic EL elements in a flexible surface light-emitting unit;

FIG. 12A is a schematic view illustrating example installation of an organic EL illuminating device of the present invention;

FIG. 12B is a schematic view illustrating example installation of an organic EL illuminating device of the present invention;

FIG. 12C is a schematic view illustrating example installation of an organic EL illuminating device of the present invention;

DETAILED DESCRIPTION OF PREFERRED EMBODIMENTS

Figure 1:
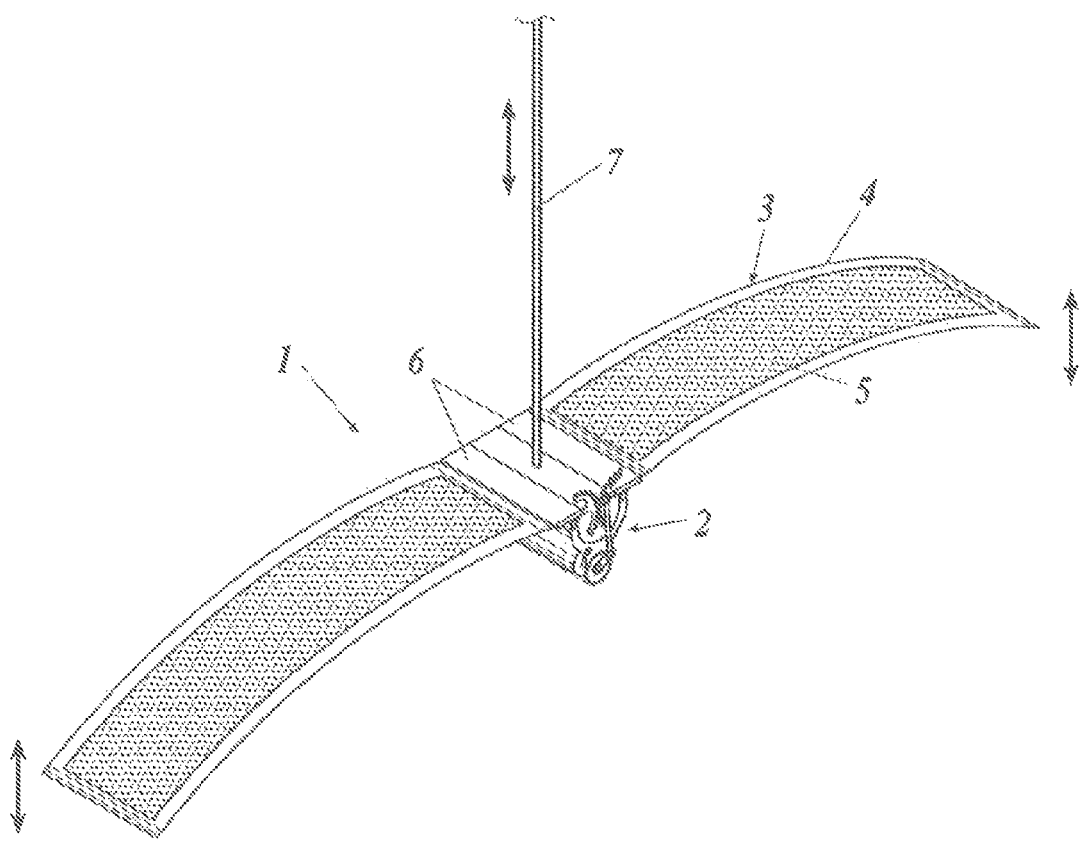
FIG. 1 is a schematic view of an example organic EL illuminating device including a, driving unit provided, with a pair of flexible surface light-emitting units.

An organic electroluminescent illuminating device of the present invention includes one or more flexible surface light-emitting units composed of a flexible substrate and at least one organic electroluminescent element disposed thereon, and a single driving unit for driving the flexible surface light-emitting unit, at least a portion of the flexible surface light-emitting unit being connected to the driving unit. This technical feature is common, to Aspects 1 to 12.

In a preferred embodiment of the present invention, at least two flexible surface light-emitting units are connected to the driving unit to more efficiently exhibit the advantageous effects of the present invention, i.e., to provide an artistic illuminating device or a decorative gorgeous room ornament that moves naturally.

In a preferred embodiment of the present invention, the flexible surface light-emitting unit is an elongated strip to provide an artistic illuminating device or a decorative gorgeous room ornament that moves naturally.

In a preferred embodiment of the present invention, both ends of the flexible surface light-emitting unit are connected to the driving unit so as to form a loop, to provide an artistic three-dimensional illuminating device or a decorative gorgeous room ornament.

Preferably, three or more flexible surface light-emitting units are connected to the driving unit in order to emit a satisfactory amount of light and provide a gorgeous eye-catching three-dimensional illuminating device.

The flexible substrate is a flexible resin film, a flexible metal plate, or a flexible glass plate so that the flexible surface light-emitting unit can be transparent or translucent and move naturally.

In a preferred embodiment of the present invention, the organic electroluminescent element is disposed only at an end of the flexible surface light-emitting unit, or multiple organic electroluminescent elements are disposed continuously or discretely over the entire flexible surface light-emitting unit.

Preferably, one of the organic electroluminescent elements emits white, blue, green, or red light in order to achieve a variety of types of room lighting for various situations.

The present invention, components of the invention, and embodiments of the invention will now be described in detail. In the description below, "–" is used, to indicate that the numbers on both sides are lower and upper limits.

<Organic EL Illuminating Device>

An organic EL illuminating device of the present invention includes one or more flexible surface light-emitting units composed of a flexible substrate and at least one organic electroluminescent element disposed thereon, and a single driving unit for driving the flexible surface light-emitting unit, at least one flexible surface light-emitting unit being connected to the driving unit.

Such an organic EL illuminating device can serve as an artistic and decorative gorgeous ornament that can move naturally and smoothly.

Embodiments of the organic EL illuminating device of the present invention will now be described with reference to the attached drawings.

First Embodiment

In the first embodiment, a pair of flexible surface light-emitting units is disposed in a driving unit 2.

The organic EL illuminating device of the present invention includes one or more flexible surface light-emitting units and a driving unit, at least a portion of the flexible surface light-emitting unit being connected to the driving unit. In a preferred embodiment, at least two flexible surface light-emitting units are connected to the driving unit, and the flexible surface light-emitting units are paired.

FIG. 1 is a schematic view of an example organic EL illuminating device including a driving unit 2 and a pair of flexible surface light-emitting units 3 mounted thereto.

With reference to FIG. 1, in the organic EL illuminating device 1 of the present invention, the pair of flexible surface light-emitting units 3 is connected to the driving unit 2 through surface light-emitting unit fixing plates 6 of the driving unit 2 provided with a mechanism for driving the flexible surface light-emitting units 3. The flexible surface light-emitting units 3 are each mainly composed of a flexible substrate 4 and a film organic EL element 5 (serving as a light-emitting unit) disposed thereon. In FIG. 1, the organic EL element 5 is disposed continuously over each of the entire flexible surface light-emitting units 3. The area, of the organic EL element 5 can be adjusted as needed.

The organic EL illuminating device 1 can be made to look like a light-emitting ornament smoothly flying in a room, in the following process: the organic EL illuminating device 1 including the pair of flexible surface light-emitting units 3 is fixed to a hanger 7 such as a wire and hung from the ceiling, the flexible surface light-emitting units 3 of the organic EL illuminating device 1 are moved upward and downward so that they can look like wings, and the organic EL illuminating device 1 is moved upward and downward through the hanger 7.

Figure 2A:
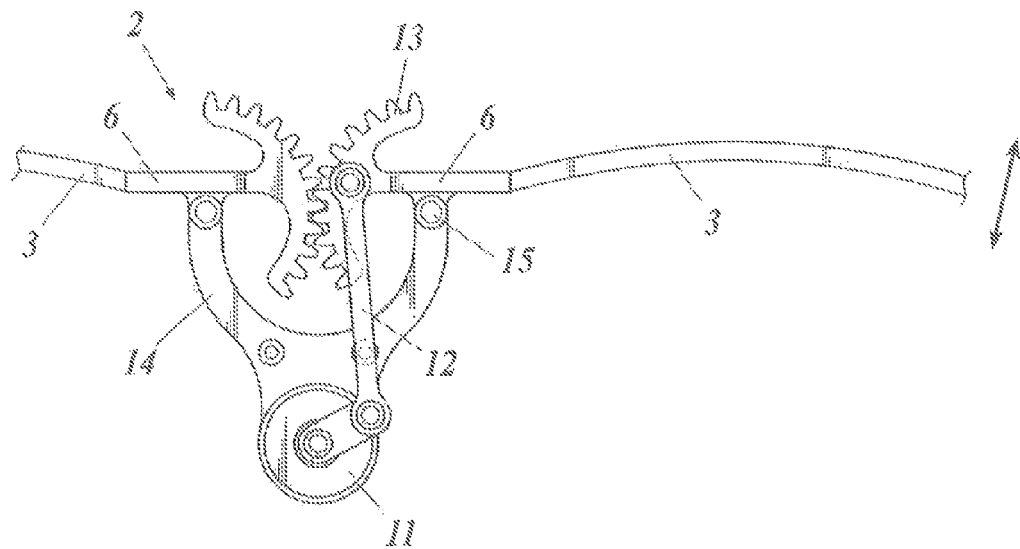
FIG. 2A is a schematic front view illustrating an example configuration of a driving unit for driving the flexible surface light-emitting units.

FIGS. 2A and 2E are schematic diagrams illustrating an example configuration of the driving unit 2 for driving the flexible surface light-emitting units shown in FIG. 1.

Figure 2B:
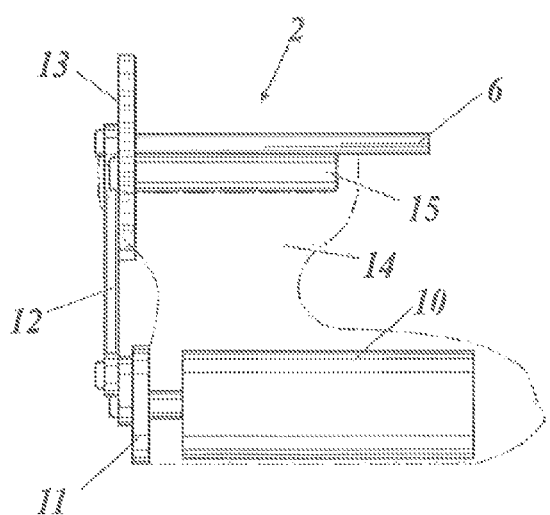
FIG. 2B is a schematic side view illustrating an example configuration of a driving unit for driving the flexible surface light-emitting units.

FIGS. 2A and 2B are a front, view and side view, respectively, of the driving unit 2.

With reference to FIGS. 2A and 2B, the driving unit 2 includes a driving motor 10, a rotating table 11 coupled to the driving motor 10, a cam mechanism 12 transferring the rotation of the rotating table 11 to a driving gear 13, and a fixing plate 6 held by the holding shaft 15 in a holder 14. The flexible surface light-emitting units 3 are mounted to the fixing plate 6.

The rotation of the driving motor 10 is transferred to the rotating table 11. The rotation of the rotating table 11 moves upward and downward the cam mechanism 12 connected thereto. Such an upward and downward movement is transferred to the driving gear 13. The flexible surface light-emitting units 3 held by the fixing plate 6 are slowly pivoted upward and downward on the holding shaft 15. Thus, the flexible surface light-emitting units emit light and express a flying bird flapping wings elegantly.

In the present invention, each flexible surface light-emitting unit of the present invention is preferably a strip to achieve smooth movement. The strip flexible surface light-emitting unit of the present invention may have any appropriate geometry for different purposes, for example, a geometry suitable for the properties of an organic EL element disposed thereon.

FIGS. 3A to 3D are schematic cross-sectional views each illustrating an example configuration of the strip flexible surface light-emitting unit 3 applicable to the organic EL illuminating device of the present invention.

Figure 3A:
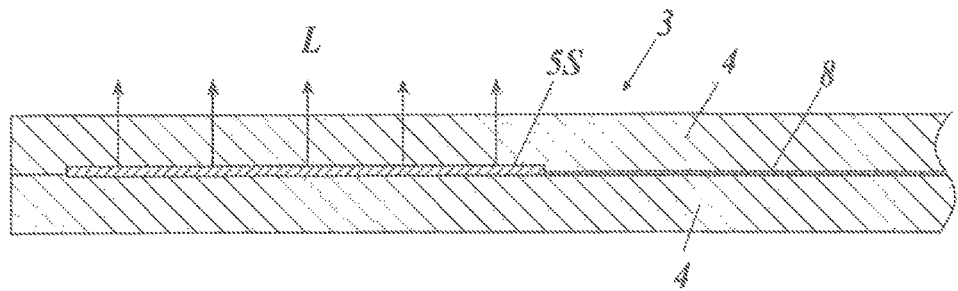
FIG. 3A is a schematic cross-sectional view illustrating an example configuration of a strip flexible surface light-emitting unit applicable to an organic EL illuminating device of the present invention.

With reference to FIG. 3A, the strip-like flexible surface light-emitting unit 3 includes a single-sided light-emitting organic EL element 5S disposed between two flexible substrates 4. The organic EL element 5S is connected to a power source (not shown) via a wire 8. As is described in detail below, the single-sided light-emitting organic EL element 5S includes a pair of electrodes: an electrode composed of an opaque material and a transparent electrode, and radiates light from the transparent electrode.

Figure 3B:
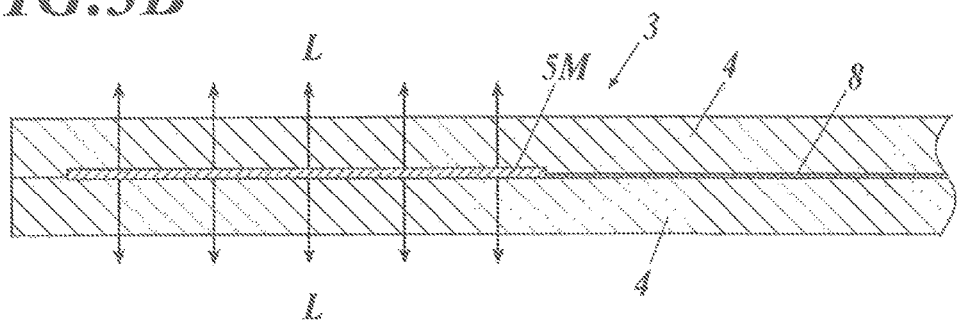
FIG. 3B is a schematic cross-sectional view illustrating an example configuration of a strip flexible surface light-emitting unit applicable to an organic EL illuminating device of the present invention.

With reference to FIG. 3B, the strip flexible surface light-emitting unit 3 includes a double-sided light-emitting organic EL element 5M disposed between two flexible substrates 4. The organic EL element 5M is connected to a power source (not shown) via a wire 8. As is described in detail below, the double-sided light-emitting organic EL element 5M includes a pair of light-transmitting or transparent electrodes, and radiates light from both electrodes.

Figure 3C:
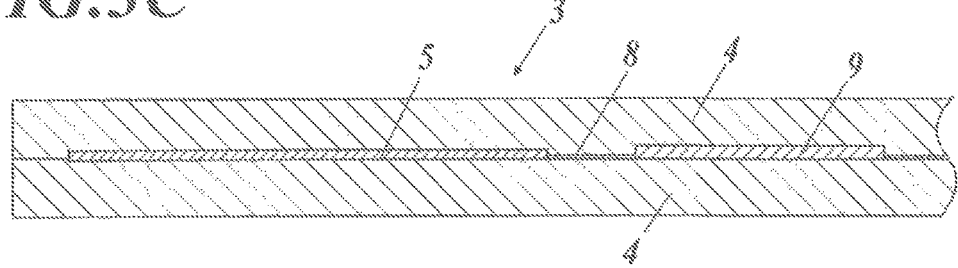
FIG. 3C is a schematic cross-sectional view illustrating an example configuration of a strip flexible surface light-emitting unit applicable to an organic EL illuminating device of the present invention.

In FIG. 3C, a thin-film battery 9 is used as a power source.

Figure 3D:
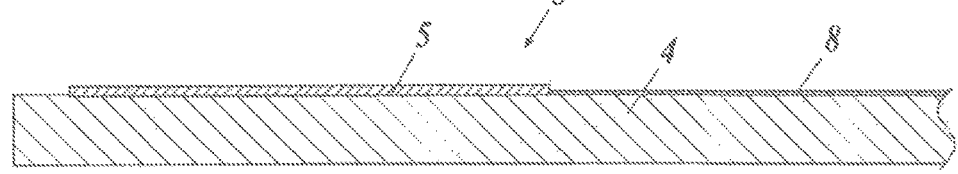
FIG. 3D is a schematic cross-sectional view illustrating an example configuration of a strip flexible surface light-emitting unit applicable to an organic EL illuminating device of the present invention.

As shown in FIG. 3D, an organic EL element may be provided on a single flexible substrate 4.

(Flexible Substrate)

The flexible substrate 4 of the present invention may be composed of any material and is preferably a flexible resin film, a flexible metal plate, or a flexible glass plate, more preferably a flexible resin film.

Examples of the material for flexible resin films applicable to the present invention include polyesters, such as polyethylene terephthalate (PET) and polyethylene naphthalate (PEN); polyolefins, such as polyethylene and polypropylene; cellulose esters, such as cellophane and cellulose acetate; polyvinylidene chloride; polyvinyl alcohol; polyethylene vinyl alcohol; syndiotactic polystyrene; polycarbonates; polymethylpentene; polyether ketones; polyimides; polyether sulfones (PESs); polyphenylene sulfides; polysulfones; polyether imides; polyamides; fluorocarbon resins; (meth)acrylic resins; and cycloolefin resins, such as norbornene resins.

The flexible metal plate may be a thin flexible plate of aluminum, stainless steel, copper, iron, sine, tin, or an alloy thereof.

The flexible glass plate may be a glass film having a thickness of 50 μm to 500 μm made by the overflow downdraw technique disclosed in Japanese Unexamined Patent Application Publication No. 2010-112532.

The flexible substrate 4 may be either transparent, translucent, or opaque provided that the organic EL illuminating device can emit a sufficient amount of light from the surface light-emitting element. The flexible substrate 4 is preferably a transparent or translucent substrate.

The organic EL element 5 will be described in detail below.

Second Embodiment

In the organic EL illuminating device of the present invention, three or more flexible surface light-emitting units are preferably connected to the driving unit. More preferably, two or more pairs of flexible surface light-emitting units are mounted to the driving unit.

Figure 4:
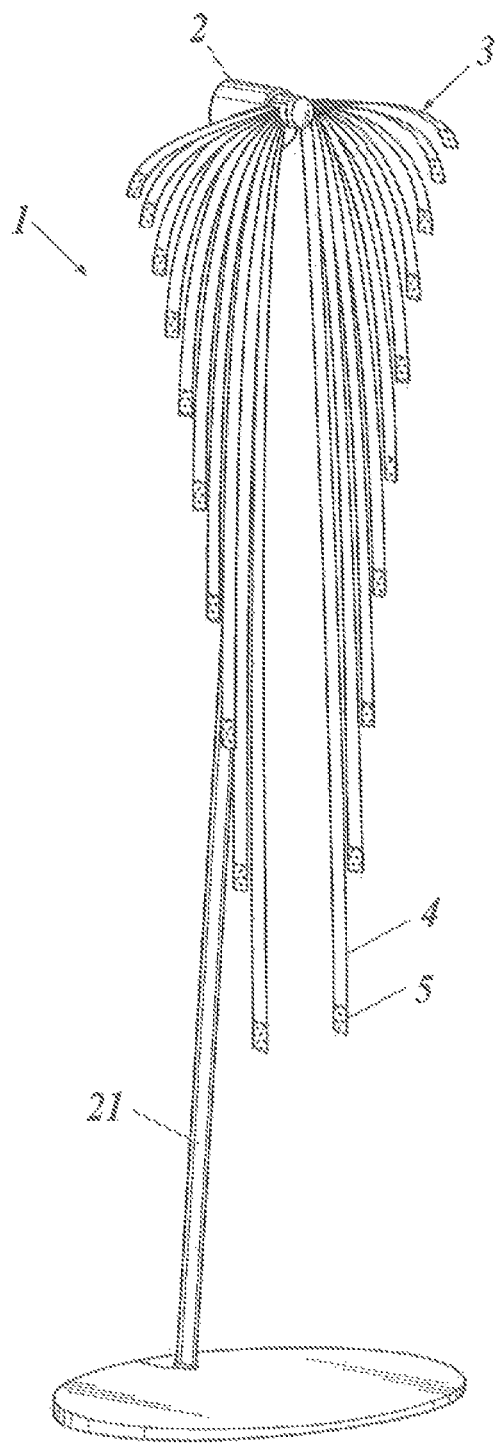
FIG. 4 is a schematic view illustrating an example organic EL illuminating device provided with multiple pairs of flexible surface light-emitting units.

FIG. 4 is a schematic view illustrating an example organic EL illuminating device provided with multiple pairs of flexible surface light-emitting units 3.

The organic EL illuminating device 1 in FIG. 4 includes multiple pairs of flexible surface light-emitting units 3 mounted to the driving unit 2, is held by a stand 21, and serves as an organic EL illuminating device for use in a room.

The multiple flexible surface light-emitting units 3 are each connected to the driving unit 2 at its one end. An end of each flexible substrate 4 is provided with an organic EL element 5.

Figure 5A:
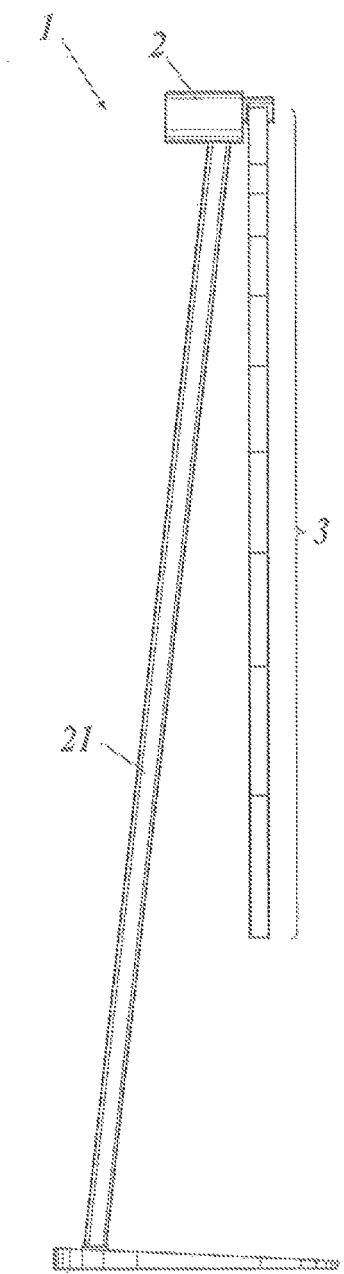
FIG. 5A is a side view of the organic EL illuminating device in FIG. 4.
Figure 5B:
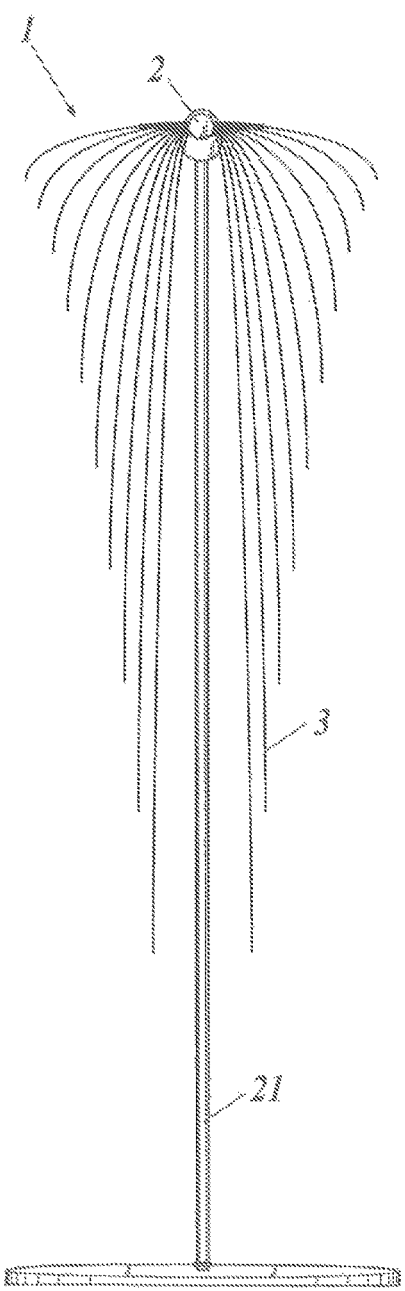
FIG. 5B is a front view of the organic EL illuminating device in FIG. 4.

FIGS. 5A and 5B are a side view and front view, respectively, of the organic EL illuminating device in FIG. 4.

The organic EL illuminating device of the present invention is characterized in that each flexible surface light-emitting unit is connected to the driving unit and is driven thereby.

With reference to FIGS. 6 and 7, a method will now be described of driving the flexible surface light-emitting units of the organic EL illuminating device shown in FIG. 4.

FIG. 6 is a schematic view illustrating an example state of the driving unit 2 holding the flexible surface light-emitting units 3.

In FIG. 6, the flexible surface light-emitting units 3 are disposed on the right and left of the driving unit 2 shown in FIG. 4. The following description relates to the right flexible surface light-emitting units 3. The description of the left flexible surface light-emitting units 3 will be omitted.

Referring to FIG. 6, the driving unit 2 includes a driving plate holder 17 in its center, and multiple driving plates 18 are disposed around the driving plate holder 17. The driving plates 18 are connected to a drive in the driving plate holder 17. The driving plates 18 are individually driven upward and downward under a given condition.

A flexible stir face light-emitting unit holder 19 for fixing the flexible surface light-emitting unit 3 is provided at an end of each driving plate 18.

Thus, each flexible surface light-emitting unit 3 vertically moves independently, resulting in a fantastical illuminating device with the flexible surface light-emitting units swinging smoothly while emitting light.

FIG. 7 is a schematic view illustrating an example internal configuration of the driving unit.

In FIG. 7, the driving plates 19 in the driving plate holder 17 holding the flexible surface light-emitting unit 3 are individually actuated by operating the drive 22 in accordance with an instruction from a controller 23.

For the organic EL illuminating device in FIGS. 4 to 7, a flexible surface light-emitting unit 3 is driven by being held by a corresponding independent driving plate as described above. Alternatively, a plurality of flexible surface light-emitting units 3 may be held by one driving plate.

FIG. 8 is a schematic cross-sectional view of an example organic EL illuminating device having a driving plate with a plurality of flexible surface light-emitting units disposed thereon.

The organic EL illuminating device in FIG. 8 differs from the device depicted in FIGS. 1 and 2 in that its surface light-emitting unit fixing plate 6 is provided with three flexible surface light-emitting units 3B. Driving such a plurality of flexible surface light-emitting units imparts a three-dimensional appearance to the illuminating device.

Third Embodiment

In the first and second embodiments of the organic EL illuminating device of the invention, one end of the flexible surface light-emitting unit 3 is fixed to the driving unit. In the most preferred embodiment, the both ends of the flexible surface light-emitting unit of the invention are connected ho the driving unit to form a loop.

Such a loop shape of the flexible surface light-emitting unit leads to a voluminous and three-dimensional illuminating device that creates a relaxing atmosphere.

Figure 9A:
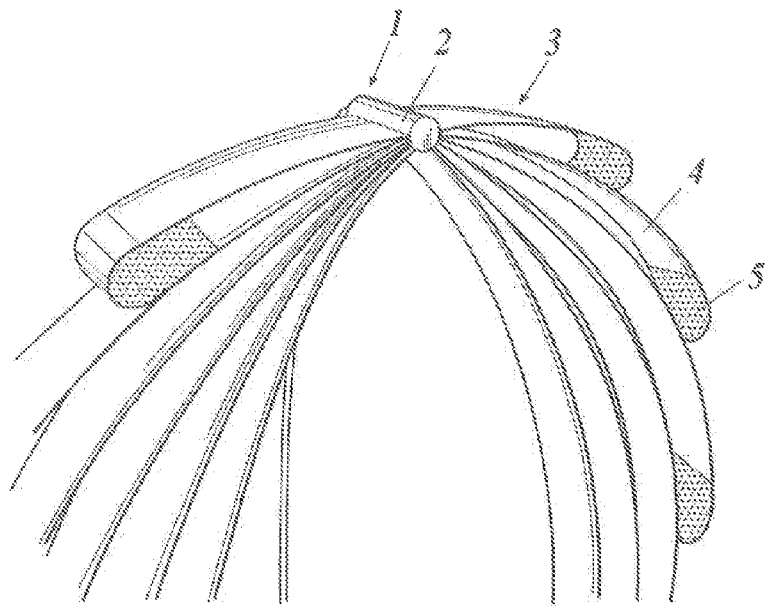
FIG. 9A is a schematic view of an example organic EL illuminating device with a driving unit connected to loop flexible surface light-emitting units.
Figure 9B:
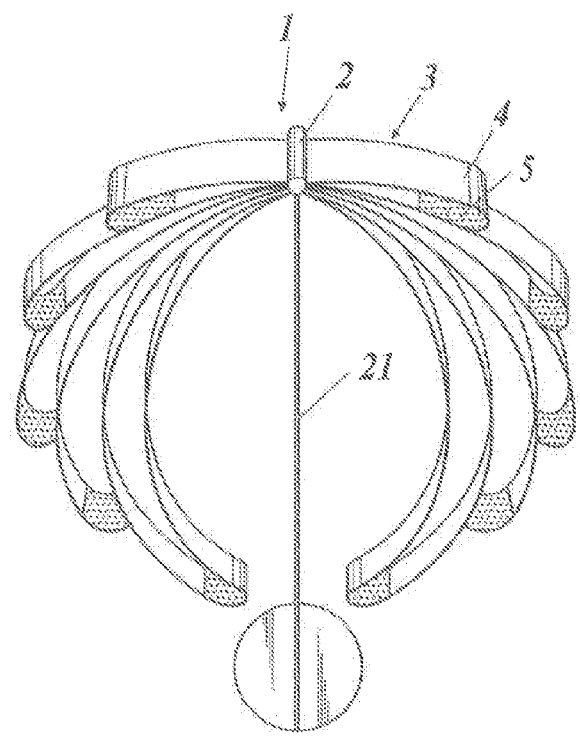
FIG. 9B is a schematic view of an example organic EL illuminating device with a driving unit connected to loop flexible surface light-emitting units.

FIGS. 9A, 9B and 10 each illustrate an example organic EL illuminating device with a driving unit connected to loop flexible surface light-emitting units.

The organic EL illuminating device in FIGS. 9A, 9B and 10 has the same structure as the organic EL illuminating device in FIGS. 4 to 7 in which one end of the flexible surface light-emitting unit is fixed to the driving unit, except that its flexible surface light-emitting unit has a loop shape.
(Arrangement of Organic EL Element in Flexible Surface Light-Emitting Unit)

In one embodiment of the organic EL illuminating device of the present invention, the organic EL element is disposed only at an end of the flexible surface light-emitting unit to effectively express movement and to provide an illuminating device with dramatic or decorative impact.

The organic EL element is preferably disposed over the entire flexible surface light-emitting unit for high illumination efficiency.

FIGS. 11A to 11C are schematic views illustrating example arrangements of organic EL elements in a flexible surface light-emitting unit.

In FIG. 11A, an organic EL element 5 is disposed in an end of the flexible substrate provided with the flexible surface light-emitting unit which is fixed to the driving unit 2 at one end. Although not shown, the organic EL element is wired to appropriate electrodes to emit light.

In FIG. 11B, an organic EL element 5 is disposed over the entire flexible substrate provided with the flexible surface light-emitting unit which is fixed to the driving unit 2 at one end.

The flexible surface light-emitting unit in FIG. 11C may be provided with a tandem organic EL element 5W emitting white light, in combination with claimable organic EL elements 5B, 5G, and 5R emitting blue, green, and red light, respectively.

The details of the tandem organic EL element and the dimmable organic EL elements will be described later.
(Installation of Organic EL Illuminating Device)

The organic EL illuminating device of the present invention has a sufficient three-dimensional appearance and sense of depth, can express action, has dramatic and decorative impact, and can be placed anywhere in the room.

In a preferred embodiment, the organic EL illuminating device of the present invention is mounted to a stand or on a wall or hung from the ceiling.

FIGS. 12A to 12C are schematic views each illustrating example installation of an organic EL illuminating device of the present invention.

FIG. 12A illustrates floor installation in which the organic EL illuminating device 1 is fixed to the stand 21. FIG. 12B illustrates wall installation in which the organic EL illuminating device 1 is fixed on a wall 25. FIG. 12C illustrates ceiling installation in which the organic EL illuminating device 1 is hung from a ceiling 26 with a hanger 7.

In these installation schemes, the organic EL illuminating device is preferably installed in a manner adequately producing features of the organic EL illuminating device of the present invention, i.e., a three-dimensional appearance and a sense of depth.

<Organic Electroluminescent Element>

The organic EL element will now be described in detail which is a main component of the organic EL illuminating device of the present invention.

The organic EL element in the flexible surface light-emitting unit of the present invention may have any structure, for example, any of the following layer structures (i)-(v). The light-emitting layer below is preferably composed of a blue light-emitting layer, a green light-emitting layer, and a red light-emitting layer.

(i) Transparent substrate/anode/light-emitting layer/electron transport layer/cathode/sealing adhesive/sealing element (ii) Transparent, substrate/anode/hole transport layer/light-emitting layer/electron transport layer/cathode/sealing adhesive/sealing element (iii) Transparent substrate/anode/hole transport layer/light-emitting layer/hole blocking layer/electron, transport layer/cathode/sealing adhesive/sealing element (iv) Transparent substrate/anode/hole transport layer/light-emitting layer/hole blocking layer/electron transport layer/cathode buffer layer/cathode/sealing adhesive/sealing element (v) Transparent substrate/anode/anode buffer layer/hole transport layer/light-emitting layer/hole blocking layer/electron transport layer/cathode buffer layer/cathode/sealing adhesive/sealing element The components of the organic EL element will now be described.

[Transparent Substrate]

A transparent substrate for the organic EL element of the invention is composed of a transparent material, such as glass or plastic. A preferred transparent substrate is composed of a glass, quartz, or resin film.

Examples of such a glass material include silica glass, soda-lime silica glass, lead glass, borosilicate glass, and alkali-free glass. The surface of such a glass material may be subjected to physical treatment, such as polishing, or covered with a coating of an inorganic or organic material or a hybrid coating of inorganic and organic materials in order to increase the adhesion to the adjacent layer, durability, and evenness as necessary.

Examples of the resin for the transparent substrate include polyesters, such as polyethylene terephthalate (PET) and polyethylene naphthalate (PEN); polyethylene; polypropylene; cellulose esters, such as cellophane, cellulose diacetate, cellulose triacetate (TAC), cellulose acetate butyrate, cellulose acetate propionate (CAP), cellulose acetate phthalate, and cellulose nitrate, and derivatives of such cellulose esters; polyvinylidene chloride; polyvinyl alcohol; polyethylene vinyl alcohol; syndiotactic polystyrene; polycarbonates; norbornene resins; polymethyl pentene; polyether ketones; polyimides; polyether sulfones (PESs); polyphenylene sulfides; polysulfones; polyether imides; polyether ketone imides; polyamides; fluoroplastics; nylons; poly(methyl methacrylate); acrylic resins; polyarylates; and cycloolefin resins, such as ARTON™ (produced by JSR), and APEL™ (produced by MITSUI CHEMICALS, INC.).

The surface of the transparent substrate is preferably cleaned by a surface activating process, such as corona treatment, plasma treatment, and flame treatment.

[Anode: First Electrode]

A first electrode provided on one surface of the transparent substrate is a transparent electrode serving as an anode.

Examples of the material for the first electrode (the transparent electrode) include metals, such as Ag and Au; alloys mainly composed of a metal; CuI; and metal oxides, such as indium tin oxide (ITO), $SnO_2$, and ZnO. In order to achieve the objects of the present invention, in particular, to optimize a difference in the refractive index between the first electrode and the charge injection layer, the first electrode is preferably composed of a metal or an alloy mainly composed of a metal, more preferably, silver or an alloy mainly composed of silver.

The silver for the first electrode serving as a transparent electrode is preferably at a purity of 99% or more. Palladium (Pd), copper (Cu), gold (An), or any other component may be added to enhance the stability of the silver.

For a transparent electrode composed of a silver alloy, the alloy preferably has a silver content of 50% or more. Examples of such an alloy include silver magnesium (AgMg), silver copper (AgCu), silver palladium (AgPd), silver palladium copper (AgPdCu), silver indium (AgIn), silver gold (AgAu), silver aluminum (AgAl), silver zinc (AgZn), silver tin (AgSn), silver platinum (AgPt), silver titanium (AgTi), and silver bismuth (AgBi).

Examples of a process for forming such a transparent electrode include wet processes, such as a coating method, an Inkjet method, and a dipping method; and dry processes, such as deposition (e.g., resistance heating and an EB method), sputtering, and CVD. A preferred process is deposition. A base layer containing a nitrogen atom may be provided between the transparent electrode and the transparent substrate. A transparent electrode of silver or an alloy mainly composed of silver preferably has sufficiently high conductivity without annealing or any other process and may optionally undergo high-temperature annealing after its formation.

[Intermediate Electrode]

The organic EL element of the present invention includes a laminate consisting of two or more organic functional layer units between the first electrode and the second electrode. The two or more organic functional layer units are separated by an intermediate electrode layer unit having an isolated connection terminal for establishing electrical connection.

[Organic Functional Layer Unit]

The layers of the organic functional layer unit, i.e., a charge injection layer, a light-emitting layer, a hole transport layer, an electron transport layer, and a blocking layer will now be described in order.

(Charge Injection Layer)

A charge injection layer of the present invention is provided between an electrode and a light-emitting layer to lower the drive voltage and increase the luminance. The details on the charge injection layer are described in "Denkyoku Zairyo (Electrode Material)", pp. 123-166, Part 2, Chapter 2, "Yuki EL Soshi To Sono Kogyoka Saizensen (Organic EL elements and their Industrial Forefront)", published, by NTS, Nov. 30, 1998. Charge injection layers are categorized into hole injection layers and electron injection layers.

A hole injection layer can be usually provided between an anode and a light-emitting layer or a hole transport layer. An electron injection layer can be usually provided between a cathode and a light-emitting layer or electron transport layer.

In the present invention, a charge injection layer is preferably disposed adjacent to a transparent electrode. If an intermediate electrode is provided, at least one of the adjacent electron injection layer and hole injection layer preferably has the above-described advantageous effects.

A hole injection layer of the present invention is provided adjacent to an anode, which is a transparent electrode, to lower the drive voltage and increase the luminance. The details on the hole injection layer are described in "Denkyoku Zairyo (Electrode Material)", pp. 123-166, Part 2, Chapter 2, "Yuki EL Soshi To Sono Kogyoka Saizensen (Organic EL elements and their Industrial Forefront)", published by NTS, Nov. 30, 1998.

The hole injection layer is also described in detail in Japanese Unexamined Patent Application Publication Nos. H9-45479, H9-260062, and H8-288069. Examples of the material for the hole injection layer include porphyrin derivatives; phthalocyanine derivatives; oxazole derivatives; oxadiazole derivatives; triazole derivatives; imidazole derivatives; pyrazoline derivatives; pyrazolone derivatives; phenylenediamine derivatives; hydrazone derivatives; stilbene derivatives; polyarylalkane derivatives; triarylamine derivatives; carbazole derivatives; indolocarbazole derivatives; isoindole derivatives; acene derivatives, such as naphthalene and anthracene; fluorene derivatives; fluorenone derivatives; and polymer and oligomer materials having a main chain or side chain of polyvinyl carbazole or an aromatic amine; polysilanes; and conductive polymers and oligomers (e.g., poly(3,4-ethylenedioxythiophene)-poly (styrene sulfonate) (PEDOT-PSS), aniline copolymers, polyaniline, and polythiophene).

Examples of triarylamine derivatives include benzidines, such as 4,4'-bis[N-(1-naphthyl)-N-phenyl-amino]biphenyl (α-NPD); starburst compounds, such as 4,4',4"-tris[N-(3-methylphenyl)-N-phenylamino]triphenylamine (MT-DATA); and compounds containing a fluorine or anthracene core that connects three aryl amines.

The hexaazatriphenylene derivatives disclosed in Published Japanese Translation of PCT International Publication for Patent Application 2003-519432 and Japanese Unexamined Patent Application Publication No. 2006-135145 also serve as hole transport materials.

An electron injection layer is disposed between a cathode and a light-emitting layer to decrease the drive voltage and increase the luminance. If the cathode is a transparent electrode of the present invention, the electron injection layer is disposed adjacent to the transparent electrode. The details on the electron injection layer are described in "Denkyoku Zairyo (Electrode Material)", pp. 123-166, Part 2, Chapter 2, "Yuki EL Soshi To Sono Kogyoka Saizensen (Organic EL elements and their Industrial Forefront)", published by NTS, Nov. 30, 1998.

The electron injection layer is also described in detail in Japanese Unexamined Patent Application Publication Nos. H6-325871, H9-17574, and H10-74586. Examples of preferred materials for the electron injection layer include metals, such as strontium and aluminum; alkali metal compounds, such as lithium fluoride, sodium fluoride, and potassium fluoride; alkaline earth metal compounds, such as magnesium fluoride and calcium fluoride; metal oxides, such as molybdenum oxide and aluminum oxide; and metal complexes, such as lithium 8-hydroxyquinolate (Liq). The transparent electrode of the present invention serving as a cathode is most preferably composed of an organic material, such as a metal complex. The electron injection layer is preferably a significantly thin film having a thickness of 1 nm to 10 μm, although the thickness depends on the material to be used.

In the present invention, the material for the charge injection layer is selected regarding the refractive index of a metal or an alloy mainly composed of a metal for the transparent electrode such that the average Δn of absolute differences in the refractive indices between the charge injection layer and the transparent electrode lies in the range of 0.5 to 2.0.

(Light-Emitting Layer)

A light-emitting layer for the organic functional layer unit in the organic EL element of the present invention preferably contains a phosphorescent compound as a light-emitting material.

Such a light-emitting layer emits light generated by recombination of electrons from an electrode or an electron transport layer and holes from the hole transport layer. Such light emission may occur in the light-emitting layer or at the interface between the light-emitting layer and the adjacent layer.

Such a light-emitting layer may have any structure provided that its light-emitting material satisfies requirements for light emission. Such a light-emitting layer may include multiple layers having the same emission spectrum or maximum emission wavelength. In such a structure, a non-light-emitting intermediate layer preferably lies between the light-emitting layers.

The total thickness of the light-emitting layers is preferably in the range of 1-100 nm, more preferably in the range of 1-30 nm to achieve a lower drive voltage. The total thickness of the light-emitting layers is the sum of the thicknesses of the light-emitting layers and non-light-emitting intermediate layers therebetween.

In a preferred embodiment of the present invention, a laminate consists of two or more light-emitting layer units. The thickness of each light-emitting layer is preferably adjusted within the range of 1-50 nm, more preferably 1-20 nm. If the laminate consists of multiple light-emitting layers emitting blue, green, and red light, respectively, these light-emitting layers should not have any correlation on thickness.

Such light-emitting layers can be produced by any known process, such as vacuum deposition, spin coating, casting, a Langmuir Blodgett (LB) method, or an inkjet method with light-emitting materials or host compounds, which will be described below.

Each light-emitting layer may contain a mixture of multiple light-emitting materials. For instance, the light-emitting layer may contain a mixture of a phosphorescent material and a fluorescent material (also referred to as fluorescent dopant or fluorescent compound). The light-emitting layer preferably contains a host compound (emission host) and a light-emitting material (emission dopant compound) that emits light.

<Host Compound>

The host compound in the light-emitting layer preferably has a phosphorescence quantum yield of less than 0.1, more preferably less than 0.01 at room temperature (25° C.). The volume content of the host compound in the light-emitting layer is preferably 50% or more.

A known host compound may be used alone. Alternatively, multiple host compounds may be used in combination. A combination of multiple host compounds enables the control of the electron transfer and increases the efficiency of the organic electroluminescent element. A combination of two or more of the light-emitting materials described below allows for emission of mixed light of different colors, and thus the emission of light of any color.

The host compound for the light-emitting layer may be a known low-polymer compound, a polymer compound having repeating units, or a low-molecular-weight compound having a polymerizable group, such as a vinyl group or an epoxy group (deposited polymerizable emission host).

Examples of the host compound applicable to the present invention include those disclosed in Japanese Unexamined Patent Application Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-239060, 2002-302516, 2002-305083, 2002-305084, and 2002-308837, U.S. Patent application publication Nos. 2003/0175553, 2006/0280965, 2005/0112407, 2009/0017330, 2003/0030202, and 2005/2383919, WO 2001/039234, WO 2009/021126, WO 2008/056746, WO 2004/093207, WO 2005/089025, WO 2007/063796, WO 2007/063754, WO 2004/107822, WO 2005/030900, WO 2006/114966, WO 2009/086028, WO 2009/003898, WO 2012/023947, Japanese Unexamined Patent Application Publication Nos. 2008-074939 and 2007-254297, and EP Patent Publication No. 2034538.

<Light-Emitting Material>

Examples of the light-emitting material applicable to the present invention include phosphorescent compounds (also referred to as phosphorescent materials or phosphorescent dopants) and fluorescent compounds (or fluorescent materials).

<Phosphorescent Compound>

A phosphorescent compound exhibits emission from its triplet state, specifically, exhibits phosphorescence at room temperature (25° C.), and has a phosphorescence quantum yield of 0.01 or more, preferably 0.1 or more at 25° C.

Such a phosphorescence quantum yield can be measured by the process described in "Bunko II", "Dai 4 Han Jikken Kagaku Koza 7" p. 398, published by Maruzen, 1992. The phosphorescence quantum yield in a solution can be measured with various solvents. A phosphorescent compound used in the present invention preferably has a phosphorescence quantum yield of 0.01 or more in a predetermined solvent.

The phosphorescent compound may be known compounds used for light-emitting layers of common organic EL elements and is preferably a complex compound of any of Group 8 to 10 metals, more preferably an iridium compound, an osmium compound, a platinum compound (a platinum complex compound), or a rare earth complex, most preferably an iridium compound.

In the present invention, at least one light-emitting layer may contain two or more phosphorescent compounds, and the concentration of a phosphorescent compound in a light-emitting layer may vary across the thickness of the light-emitting layer.

Examples of known, phosphorescent compounds applicable to the present invention include those described in the following documents.

Nature 335, 151 (1398), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, and U.S. Patent application publication Nos. 2006/835469, 2006/0202194, 2007/0087321, and 2005/0244673.

Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1246 (2003), WO 2009/050290, WO 2002/015645, WO 2009/000673, U.S. Patent application publication No. 2002/0034656, U.S. Pat. No. 7,332,232, U.S. Patent application publication. Nos. 2009/0108737 and 2009/0039776, U.S. Pat. Nos. 6,921,915 and 6,687,266, U.S. Patent application, publication Nos. 2007/0190359, 2006/0008670, 2009/0165846, and 2008/0015355, U.S. Pat. Nos. 7,250,226 and 7,396,598, U.S. Patent application publication Nos. 2006/0263635, 2003/0138657, and 2003/0152802, and U.S. Pat. No. 7,090,928.

Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett, 74, 1361 (1399), WO 2002/002714, WO 2006/009024, WO 2006/056418, WO 2005/019373, WO 2005/123873, WO 2005/123873, WO 2007/004380, WO 2006/082742, U.S. Patent application publication Nos. 2006/0251923 and 2005/0260441, U.S. Pat. Nos. 7,393,599, 7,534,505, and 7,445,355, U.S. Patent application publication Nos. 2007/0190359 and 2008/0297033, U.S. Pat. No. 7,338,722, U.S. Patent application publication No. 2002/0134984, U.S. Pat. No. 7,279,704, and U.S. Patent application publication Nos. 2006/098120 and 2006/103874.

WO 2005/076380, WO 2010/032663, WO 2008/140115, WO 2007/052431, WO 2011/134013, WO 2011/157339, WO 2010/086069, WO 2009/113646, WO 2012/020327, WO 2011/051404, WO 2011/004639, WO 2011/073149, Japanese Unexamined Patent Application Publication Nos. 2012-069737, 2009-114086, 2003-81988, 2002-302671, and 2002-363552.

In the present invention, the phosphorescent compound is preferably an organic metal complex containing a central metal Ir, more preferably, a complex having at least one of the following coordinations: a metal-carbon bond, a metal-nitrogen bond, a metal-oxygen bond, and a metal-sulfur bond.

The phosphorescent compound (also referred to as phosphorescent metal complex) can be prepared by any of the processes described in the following documents and the documents cited therein: Organic Letter, Vol. 3, No. 16, pp. 2573-2581 (2001); Inorganic Chemistry, Vol. 30, No. 8, pp. 1685-1687 (1991); J. Am. Chem. Soc., vol. 123, p. 4304 (2001); Inorganic Chemistry, Vol. 40, No. 7, pp. 1704-1711 (2001); Inorganic Chemistry, Vol. 41, No. 12, pp. 3055-3066 (2002); New Journal of Chemistry, Vol. 26, p. 1171 (2002); and European Journal of Organic Chemistry, Vol. 4, pp. 695-709 (2004).

<Fluorescent Compound>

Examples of the fluorescent compound include coumarin dyes, pyran dyes, cyanine dyes, croconium dyes, squarium dyes, oxobenzanthracene dyes, fluorescein dyes, rhodamine dyes, pyrylium dyes, perylene dyes, stilbene dyes, polythiophene dyes, and rare earth complex phosphors.

(Hole Transport Layer)

A hole transport layer is composed of a hole transport material having a function of transporting holes. In a wide sense, a hole injection layer and an electron blocking layer also have the same function as the hole transport layer. The hole transport layer may have a single-layer or multilayer structure.

The hole transport material has any of the following functions; the injection of holes, the transport of holes, and the block of electrons, and may be either an organic or inorganic material. Examples of the hole transport material include triazole derivatives, oxadiazole derivatives, imidazole derivatives, polyarylalkane derivatives, pyrazolone derivatives, pyrazolone derivatives, pnenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, aniline copolymers, conductive oligomers, and thiophene oligomers.

The hole transport material, which can be selected from the above-described examples, may be a porphyrin compound, an aromatic tertiary amine compound, or a styrylamine compound, preferably an aromatic tertiary amine compound.

Typical examples of the aromatic tertiary amine compounds and styrylamine compounds include
N,N,N',N'-tetrapheny-4,4'-diaminophenyl,
N,N'-dipnenyl-N,N'-bis(3-methylphenyl)-[1,1'-biphenyl]-4, 4'-diamine (abbreviated as TPD),
2,2-bis(4-di-p-tolylaminophenyl) propane,
1,1-bis(4-di-p-tolylaminophenyl)cyclohexane,
N,N,N',N'-tetra-p-tolyl-4,4'-diaminobiphenyl,
1,1-bis(4-di-p-tolylaminophenyl)-4-phenylcyclohexane,
bis(4-dimethylamino-2-methylphenyl)phenylmethane,
bis(4-di-p-tolylaminophenyl)phenylmethane,
N,N'-diphenyl-N,N'-di(4-methoxyphenyl)-4,4'-diaminobiphenyl,
N,N,N',N'-tetraphenyl-4,4'-diaminodiphenylether,
4,4'-bis(diphenylamino)quadriphenyl,
N,N,N-tri(p-tolyl)amine,
4-(di-p-tolylamino)-4'-[4-(di-p-tolylamino)styryl]stilbene,
4-N,N-diphenylamino-(2-diphenylvinyl)benzene,
3-methoxy-4'-N,N-diphenylaminostilbenzene, and N-phenyl carbazole.

The hole transport layer can be formed into a thin film of the hole transport material by vacuum deposition, spin coating, casting, printing including an inkjet method, a Langmuir Blodgett (LB) method, or any other known process. The hole transport layer saw have any thickness, normally has a thickness of about 5 nm-5 µm, and preferably has a thickness of 5-200 nm. The hole transport layer may be a single layer composed, of one or more of the above-listed materials.

The material for the hole transport layer may be doped with an impurity to enhance the p-type conductivity. Examples of the documents disclosing such an approach include Japanese Unexamined Patent Application Publication Nos. H4-297076, 2000-196140, 2001-102175, and J. Appl. Phys., 95, 5773 (2004).

Enhancing the p-type conductivity of the hole transport layer is preferred to reduce the power consumption of the element.

(Electron Transport Layer)

An electron transport layer is composed of a material transporting electrons. In a wide sense, electron injection layers and hole blocking layers are categorized in electron transport layers. The electron transport layer may have a single-layer or multilayer structure.

In a single-layer or multilayer electron transport layer, an electron transport material (serving as a hole blocking material) constituting the portion adjoining a light-emitting layer preferably has a function of transporting electrons from the cathode to the light-emitting layer. Such an electron transport material may be selected from conventional compounds. Examples of the electron transport material include nitro-substituted fluorene derivatives, diphenylquinone derivatives, thiopyran dioxide derivatives, carbodiimide, fluorenylidenemethane derivatives, anthraquinodimethane, anthrone derivatives, and oxadiazole derivatives. The electron transport layer may be composed of a thiadiazole derivative prepared by the substitution of a sulfur atom for an oxygen atom of an oxadiazole ring in an oxadiazole derivative; a quinoxaline derivative containing a quinoxaline ring known as an electron-withdrawing group; a polymer material having a polymer chain of any of the above-described materials; or a polymer material having a polymer main chain of any of the above-described materials.

Alternatively, the electron transport layer may be composed of a metal complex of an 8-quinolinol derivative, such as tris(8-quinolinol)aluminum (abbreviated as $Alq_3$), tris(5,7-dichloro-8-quinolinol)aluminum,
tris(5,7-dibromo-8-quinolinol)aluminum,
tris(2-methyl-8-quinolinol)aluminum,
tris(5-methyl-8-quinolinol)aluminum, or
bis(8-quinolinol) zinc (abbreviated as Znq); or a metal complex containing In, Mg, Cu, Ca, Sn, Ga, or Pb other than the central metals in these metal complexes.

The electron transport layer can be formed into a thin film of any of the above-described materials by vacuum deposition, spin coating, casting, printing including an inkjet method, the LB method, or any other known process. The electron transport layer may have any thickness, normally has a thickness of about 5 nm-5 µm, and preferably has a thickness of 5-200 nm. The electron transport layer may be a single layer composed of one or more of the above-listed materials.

(Blocking Layer)

Blocking layers are categorized into hole blocking layers and electron blocking layers. A blocking layer is optionally provided in addition to the above-described layers constituting the organic functional layer unit 3. Examples of such a blocking layer include the hole blocking layers described in Japanese Unexamined Patent Application Publication Nos. H11-204258 and H11-204359, and "Yuki EL Soshi To Sono Kogyoka Saizensen (Organic EL, elements and their Industrial Forefront)", published by NTS, Nov. 30, 1998, p. 237.

In a wide sense, a hole blocking layer has the same function as an electron transport layer. The hole blocking layer is composed of a hole blocking material that can transport electrons but barely transport holes, and thus can enhance the recombination of electrons and holes by transporting electrons while blocking holes. The electron transport layer may be used as a hole blocking layer as necessary. The hole blocking layer is preferably disposed adjacent to the light-emitting layer.

In a wide sense, an electron blocking layer has the same function as a hole transport layer. The electron blocking layer is composed of a material that can transport holes but barely transport electrons, and thus can enhance the recombination of electrons and holes by transporting holes while blocking electrons. The hole transport layer may be need as an electron blocking layer as necessary. The hole blocking layer of the present invention preferably has a thickness of 3-100 nm, more preferably 5-30 nm.

[Second Electrode]

The second electrode is an electrode film for supplying holes to a second organic functional layer unit or a third organic functional layer unit, and is composed of a metal, an alloy, an organic or inorganic conductive compound, or a mixture thereof. Examples of the material for the second electrode include gold; aluminum; silver; magnesium; lithium; magnesium/copper alloy; magnesium/silver alloy; magnesium/aluminum alloy; magnesium/indium alloy;

indium; lithium/aluminum alloy; rare earth metals; and oxide semiconductors, such as ITO, ZnO, TiO$_2$, and SnO$_2$.

The second electrode can be formed in a thin film of any of the above-described conductive materials by deposition, sputtering, or any other known process. The second electrode preferably has a sheet resistance of less than or equal to several hundreds Ω/sq., normally has a thickness of 5 nm-5 μm, and preferably has a thickness of 5-200 nm.

In a double-sided light-emitting organic EL element, which emits light L also from the second electrode side, the second electrode preferably has high light transmittance.

[Sealing Element]

The organic EL element of the present invention may be sealed, for example, by bonding a sealing element to the second electrode 6 and the transparent substrate with an adhesive.

The sealing element is disposed so as to cover the display area of the organic EL element, and is either a concave plate or a flat plate having any transmittance and insulating property.

The sealing element may be, for example, a glass plate, a polymer plate or film, or a metal plate or film. The glass plate may be composed of soda lime glass, glass containing barium and strontium, lead glass, aluminosilicate glass, borosilicate glass, barium borosilicate glass, quartz, or any other material. The polymer plate may be composed of polycarbonate, acrylic, polyethylene terephthalate, polyether sulfide, polysulfone, or any other material. The metal plate may be composed of at least one metal selected from the group consisting of stainless steel, iron, copper, aluminum, magnesium, nickel, sine, chromium, titanium, molybdenum, silicon, germanium, and tantalum; or alloys thereof.

The sealing element is preferably a polymer film or metal film to form a thin-film organic EL element. The polymer film preferably has a water vapor permeability of $1 \times 10^{-3}$ g/m$^2$·24 h or less measured in accordance with JIS K 7129-1992 at a temperature of 25±0.5° C. and 90≅2% RH, and an oxygen permeability of $1 \times 10^{-3}$ ml/m$^2$·24 h·atm (1 atm is $1.01325 > 10^5$ Pa) or less measured in accordance with JIS K 7125-1987.

Another preferred sealing film includes an inorganic or organic layer that covers the outer surface of the second electrode on the organic functional layer unit and adjoins the transparent substrate. In this case, the sealing files is preferably composed of any material impermeable to moisture or oxygen that causes the degradation of the organic EL element. For instance, the sealing film may be composed of silicon monooxide, silicon dioxide, silicon nitride, or any other material. The sealing film preferably has a multilayer structure consisting of such inorganic and organic layers to reduce fragility. These films may be formed by vacuum deposition, sputtering, reactive sputtering, molecular beam epitaxy, cluster ion beam, ion plating, plasma polymerization, atmospheric pressure plasma polymerization, plasma CVD, laser CVD, thermal CVD, coating, or any other process.

The space between the sealing element and the display area of the organic EL element is preferably filled with an inert gas, such as nitrogen or argon; or an inert liquid, such as fluorohydrocarbon or silicone oil. Alternatively, the space between the sealing element and the display area of the organic EL element may be evacuated or filled with a hygroscopic compound.

<Structure of Organic EL Element>

[Tandem Organic EL Element]

Figure 13:
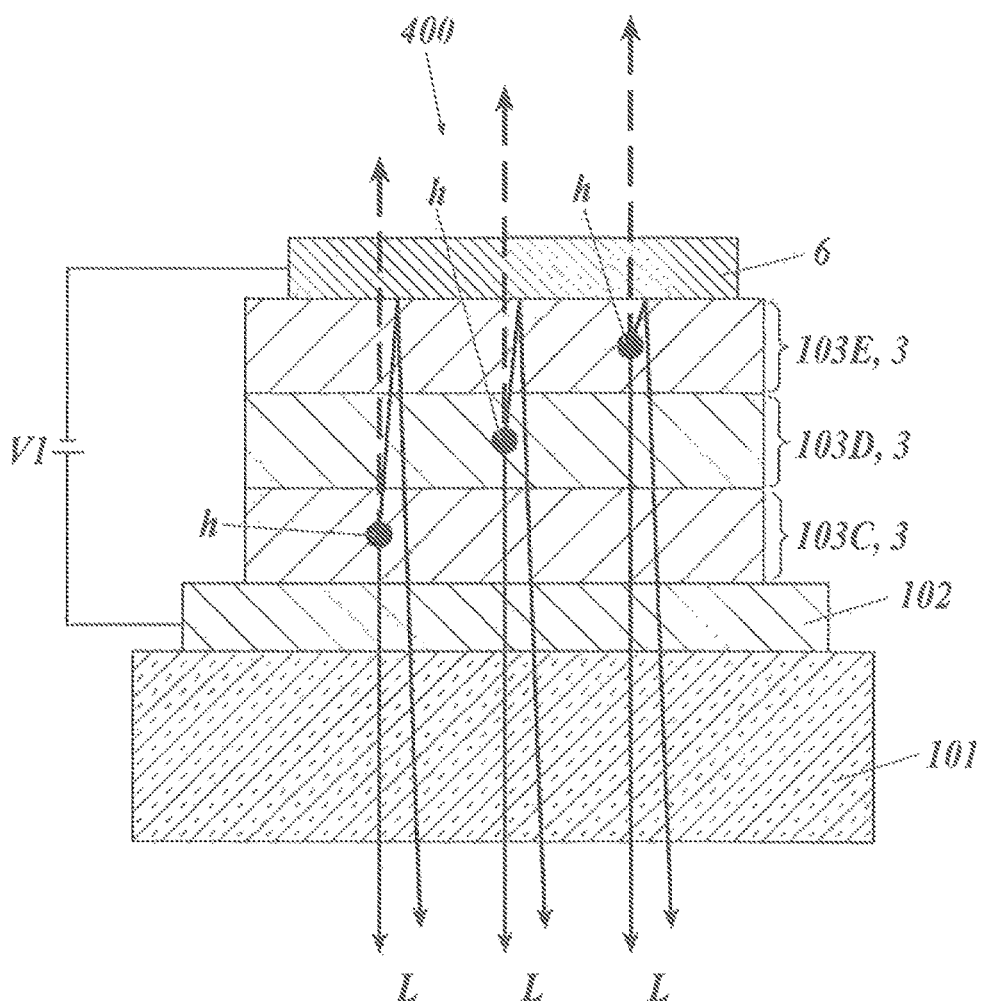
FIG. 13 is a schematic cross-sectional view illustrating an example structure of a tandem organic EL element.

FIG. 13 is a schematic cross-sectional view illustrating an example structure of a tandem organic EL element.

An organic EL element 400 in FIG. 13 is a laminate including, in sequence, a transparent substrate 101, a first electrode 102 (anode) serving as a transparent electrode, a first organic functional layer unit 103C, a second organic functional layer unit 103D, a third organic functional layer unit 103E, and a second electrode 106 (cathode) serving as a counter electrode. For example, in a combination of a first organic functional layer unit 103C emitting red light, a second organic functional layer unit 103D emitting green light, and a third organic functional layer unit 103E emitting blue light, application of a voltage across the organic EL element 400 through the first electrode 102 (anode) and the second, electrode 106 (cathode) generates white light.

[Dimmable Organic EL Element]

Figure 14:
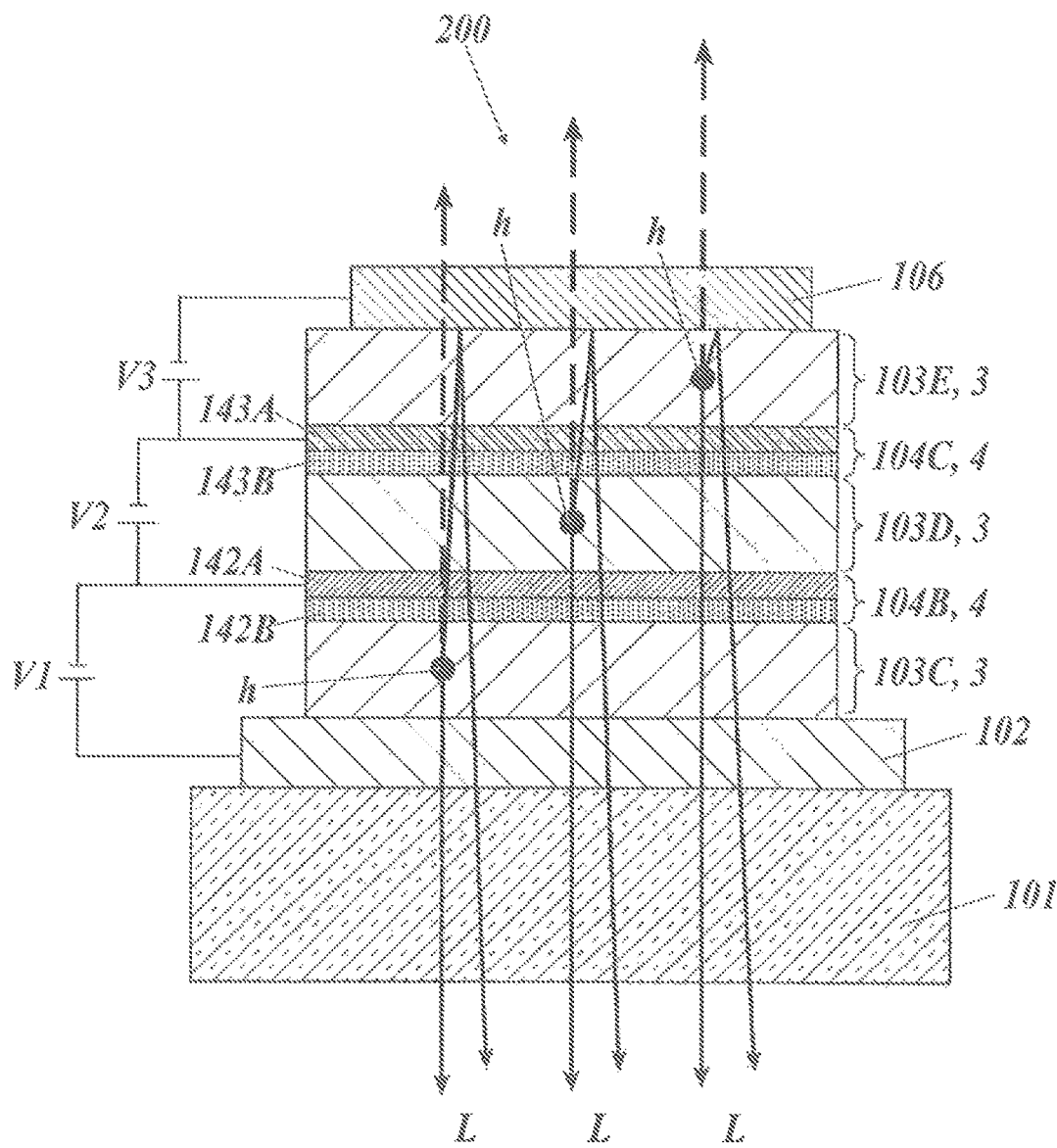
FIG. 14 is a schematic cross-sectional view illustrating an example structure of a dimmable organic EL element.

FIG. 14 is a schematic cross-sectional view illustrating an example structure of a dimmable organic EL element.

Referring to FIG. 14, an organic EL element 200 is a laminate including, in sequence, a transparent substrate 101, a first electrode 102 serving as a transparent electrode, a first organic functional layer unit 103C, a first intermediate electrode layer unit 104B, a second organic functional layer unit 103D, a second intermediate electrode layer unit 104C, a third organic functional layer unit 103E, and a second electrode 106 serving as a counter electrode. The first intermediate electrode layer unit 104B includes a nitrogen-containing base sublayer 142B adjacent to the transparent substrate 101 and an intermediate electrode 142A thereon. The second intermediate electrode layer unit 104C includes a nitrogen-containing base sublayer 143B adjacent to the transparent substrate 101 and an intermediate electrode 143A thereon. A light extracting film (not shown) is disposed on a side, remote from the first electrode 102, of the transparent substrate 101. In FIG. 14, the first electrode 102 is a transparent electrode or anode, while the second electrode 106 is a cathode.

The first electrode 102 and the first intermediate electrode 142A, which are connected to each other with a lead, each have a connection terminal at a drive voltage V1 of 2-40 V, allowing the first organic functional layer unit 103C to emit light. Similarly, the first intermediate electrode 142A and the second intermediate electrode 143A, which are connected to each other with a lead, each have a connection terminal at a drive voltage V3 of 2-40 V, allowing the second organic functional layer unit 103D to emit light. Similarly, the second intermediate electrode 143A and the second electrode 106, which are connected to each other with a lead, each nave a connection terminal at a drive voltage V3 of 2-40 V, allowing the third organic functional layer unit 103E to emit light.

Thus, voltage is applied to individual organic functional layer units to generate blue light, green light, and red light. Simultaneous emission of light of all these colors generates white light.

A dimmable organic EL element having such properties is preferably used in the structure shown in FIG. 11C, for example.

Although various exemplary embodiments have been shown and described, the invention is not limited to the embodiments shown. Therefore, the scope of the invention is intended to be limited solely by the scope of the claims that follow and its equivalents.

The present application is based on Japanese Patent Application No. 2013-183150 filed on Sep. 4, 2013 to the Japanese Patent Office, which shall be a basis for correcting mistranslations.

What is claimed is:

1. An organic electroluminescent illuminating device comprising:
   at least one flexible surface light-emitting unit which has a flexible substrate and at least one organic electroluminescent element on the flexible substrate; and
   a single driving unit which drives the flexible surface light-emitting unit, the single driving unit including a motor,
   wherein only one end of the flexible surface light-emitting unit is connected to the driving unit and a remainder of the flexible surface light-emitting unit is freely suspended therefrom, the flexible surface light-emitting unit is supported solely at the driving unit, and rotation of a drive shaft of the motor in one direction causes the one end of the flexible surface to continuously move in a reciprocal motion.

2. The organic electroluminescent illuminating device of claim 1, wherein at least two flexible surface light-emitting units are connected to the driving unit, the flexible surface light-emitting units being paired.

3. The organic electroluminescent device of claim 1, wherein the flexible surface light-emitting unit is in the form of a strip.

4. The organic electroluminescent illuminating device of claim 3, wherein both ends of the flexible strip are connected to form an elongated loop and only one end of the elongated loop is connected to the driving unit.

5. The organic electroluminescent device of claim 1, wherein at least three flexible surface light-emitting units are connected to the driving unit.

6. The organic electroluminescent illuminating device of claim 1, wherein the flexible substrate includes a flexible resin film, a flexible metal plate, or a flexible glass plate.

7. The organic electroluminescent illuminating device of claim 1, wherein the organic electroluminescent element is disposed only at an end of the flexible surface light-emitting unit.

8. The organic electroluminescent device of claim 1, wherein the organic electroluminescent element is disposed continuously or discretely over an entire surface of the flexible surface light-emitting unit.

9. The organic electroluminescent illuminating device of claim 1, wherein at least one organic electroluminescent element emits white light.

10. The organic electroluminescent illuminating device of claim 1, wherein at least one organic electroluminescent element emits blue light, green light, or red light.

11. The organic electroluminescent illuminating device of claim 1, wherein the illuminating device is fixed to a stand or on a wall.

12. The organic electroluminescent illuminating device of claim 1, wherein the illuminating device is hung from a ceiling.

13. The organic electroluminescent illuminating device of claim 1, wherein the motor is connected to the one end of the flexible surface by a cam mechanism.

14. The organic electroluminescent illuminating device of claim 1, wherein the reciprocal motion is an up and down motion.

15. The organic electroluminescent illuminating device of claim 1, wherein the reciprocal motion is a pivoting motion.

16. The organic electroluminescent illuminating device of claim 1, wherein the at least one flexible surface light-emitting unit includes two flexible surface light-emitting units connected on opposing sides of the driving unit and moved together by the single driving unit.

17. The organic electroluminescent illuminating device of claim 1, wherein the at least one flexible surface light-emitting unit includes two strips connected on opposing sides on the single driving device.

* * * * *